(12) United States Patent
Matova et al.

(10) Patent No.: US 11,327,406 B2
(45) Date of Patent: May 10, 2022

(54) ESTIMATING A PARAMETER OF A SUBSTRATE

(71) Applicant: ASML NETHERLANDS B.V., Veldhoven (NL)

(72) Inventors: Svetla Petrova Matova, Waalre (NL); Jochem Sebastiaan Wildenberg, Aarle-Rixtel (NL); Roy Werkman, Eindhoven (NL); Luc Roumen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/055,215

(22) PCT Filed: Apr. 2, 2019

(86) PCT No.: PCT/EP2019/058231
§ 371 (c)(1),
(2) Date: Nov. 13, 2020

(87) PCT Pub. No.: WO2019/219285
PCT Pub. Date: Nov. 21, 2019

(65) Prior Publication Data
US 2021/0271171 A1    Sep. 2, 2021

(30) Foreign Application Priority Data

May 16, 2018 (EP) .................................... 18172621

(51) Int. Cl.
*G03F 7/20* (2006.01)
(52) U.S. Cl.
CPC .......... *G03F 7/705* (2013.01); *G03F 7/70616* (2013.01); *G03F 7/70633* (2013.01); *G03F 7/70641* (2013.01)

(58) Field of Classification Search
CPC ..... G03F 7/705; G03F 7/70616–70683; G03F 7/70483–70541; G03F 7/70; G03F 1/44;
(Continued)

(56) References Cited

U.S. PATENT DOCUMENTS 6,952,253 B2    10/2005    Lof et al.
7,307,697 B2 *   12/2007    GanapathiSubramanian ..............
                                                          B82Y 10/00
                                                             269/21

(Continued)

OTHER PUBLICATIONS

International Search Report and Written Opinion issued in corresponding PCT Patent Application No. PCT/EP2019/058231, dated Jun. 28, 2019.

(Continued)

*Primary Examiner* — Christina A Riddle
(74) *Attorney, Agent, or Firm* — Pillsbury Winthrop Shaw Pittman LLP

(57) ABSTRACT

A method for estimating a parameter across a region on a substrate, the region being divided into a plurality of sub-regions, the method including: obtaining values of the parameter for at least two sub-regions out of the plurality of sub-regions; and estimating the parameter for a position on the region by evaluation of a function having said values of the parameter as input values, wherein the function: a) has piecewise defined base functions, wherein a single base function is defined across a sub-region; and b) is continuous between one or more adjacent sub-regions of the at least two sub-regions within the region.

20 Claims, 4 Drawing Sheets

(58) Field of Classification Search
CPC ..... G03F 1/60; G03F 1/68; G03F 1/70; G03F 1/72; G03F 1/82; G03F 1/84
USPC ............................... 355/18, 30, 52–77, 133; 250/492.1–492.3, 504 r; 430/5, 8, 22, 30; 703/2, 13
See application file for complete search history.

(56) References Cited

U.S. PATENT DOCUMENTS

| | | | |
|---|---|---|---|
| 2007/0132981 A1* | 6/2007 | Kawashima | G03F 7/70558 355/77 |
| 2010/0207017 A1* | 8/2010 | Horiuchi | H01J 37/3174 250/252.1 |
| 2011/0199596 A1 | 8/2011 | Middlebrooks | |
| 2012/0218533 A1* | 8/2012 | Lyulina | G03F 9/7046 355/53 |
| 2013/0050668 A1 | 2/2013 | Kisteman et al. | |
| 2013/0116985 A1* | 5/2013 | Bittner | G06F 17/175 703/2 |
| 2017/0068166 A1 | 3/2017 | Petri et al. | |
| 2019/0250516 A1* | 8/2019 | Buhl | G03F 7/705 |

OTHER PUBLICATIONS

Extended European Search Report issued in corresponding European Patent Application No. 18172621.7, dated Dec. 17, 2018.

* cited by examiner

ESTIMATING A PARAMETER OF A SUBSTRATE

CROSS-REFERENCE TO RELATED APPLICATIONS

This application is the U.S. national phase entry of PCT patent application No. PCT/EP2019/058231, which was filed Apr. 2, 2019, which is based upon and claims the benefit of priority of European patent application No. 18172621.7 which was filed on May 16, 2018 and which is incorporated herein in its entirety by reference.

FIELD

The present invention relates to methods for estimating parameters on a surface for lithographic processes.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

Another fine-tuning step which may be taken is to take into account the topology of the surface of the substrate to be lithographically patterned. This can be done by obtaining values of a parameter of the substrate, for example through measurements, and using these values to determine a fit of the parameter across whole or part of the substrate. The parameter fit can then be used, for example, to optimize lithographic process settings by taking the parameter topology across the substrate into account.

SUMMARY

According to the invention in an aspect, there is provided a method for estimating a parameter across a region on a substrate, the region being divided into a plurality of sub-regions, the method comprising: obtaining values of the parameter for at least two sub-regions out of said plurality of sub-regions; and estimating the parameter for a position on the region by evaluation of a function having said values of the parameter as input values, wherein the function: a) comprises piecewise defined base functions, wherein a single base function is defined across a sub-region; and b) is continuous between one or more adjacent sub-regions of the at least two sub-regions comprised within the region.

In exemplary arrangements, the parameter may comprise focus, overlay and/or dose.

Optionally, the plurality of sub-regions of the region form a rectangular grid. A rectangular grid allows the sub-regions to match directions of features which may have been patterned on the substrate. For parameters like focus and overlay, deviations and parameter features are often expressed in an x or y direction and are therefore captured better or more easily with a rectangular grid. In an alternative configuration the sub-regions can be radial sections or slices, to more accurately capture parameter features with radial dependency and features, for example dose.

Optionally, one or more of the plurality of sub-regions is substantially coincident with one or more dies or fields on the substrate.

Optionally, at least one value of the parameter is obtained per sub-region.

Optionally, at least for one sub-region no value of the parameter is obtained.

Optionally, at least for one sub-region the function is not evaluated.

Optionally, the function comprises symmetrical base functions.

Optionally, the function forms part of a spline function.

Optionally, the function is composed out of one or more non-uniform rational basis splines (NURBS). NURBS capture roll-off at an edge of a substrate while also capturing high-quality parameter estimations, achieve continuity, have adjustable sub-region size and may be described in radial and rectangular sub-regions.

Optionally, the method further comprises determining a number of measurements of the parameter associated with the region, and determining an order of the function based on the number of measurements.

Optionally, estimating the parameter across region comprises: determining a plurality of provisional estimations of the parameter based on different orders of the function; and selecting one of the provisional estimations to be the estimation of the parameter based on a performance indicator of the provisional estimations.

Optionally, the performance indicator is based on minimum and/or maximum values of the provisional estimations.

Optionally, selecting one of the provisional estimations comprises rejecting any provisional estimation having a magnitude of the minimum and/or maximum values that exceeds a magnitude of minimum and/or maximum values of the one or more measurements, and accepting any remaining provisional estimations.

Optionally, selecting one of the provisional estimations further comprises selecting one of the accepted provisional estimations based on a difference between the one or more measurements of the parameter and a value of the accepted provisional estimations at a position of the one or more measurements.

Optionally, the method further comprises selecting the provisional estimation for which the magnitude of the difference is smallest.

Optionally, the provisional estimations comprise polynomials of different orders.

Optionally, determining the plurality of provisional estimations comprises: determining a first plurality of polynomials of different orders in a first direction; determining a second plurality of polynomials of different orders in a second direction transverse to the first direction; and combining different ones of the first and second polynomials to form the plurality of provisional estimations.

According to an aspect of the invention, there is provided a computer program comprising instructions which, when executed on at least one processor, cause the at least one processor to control an apparatus to carry out a method according to any disclosed herein.

According to an aspect of the invention, there is provided an apparatus for estimating a parameter across a region on a substrate, the region being divided into a plurality of sub-regions, the apparatus comprising a processor configured to execute computer program code to undertake the method of: obtaining values of the parameter for at least two sub-regions out of said plurality of sub-regions; and estimating the parameter for a position on the region by evaluation of a function having said values of the parameter as input values, characterized in that the function is continuous between one or more adjacent sub-regions of the at least two sub-regions comprised within the region for any number of input values and any required accuracy of the estimate.

According to an aspect of the invention, there is provided a metrology system for estimating a parameter across a region on a substrate and comprising the apparatus above and/or described herein.

According to an aspect of the invention, there is provided a lithographic system comprising the metrology system above and/or described herein.

According to an aspect of the invention, there is provided a lithographic cell system comprising the lithographic system above and/or described herein.

BRIEF DESCRIPTION OF THE DRAWINGS

Embodiments of the invention will now be describes, by way of example only, with reference to the accompanying schematic drawings, in which:

FIG. 4($b$) depicts a division of a region on a substrate into sub-regions using a rectangular grid pattern.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
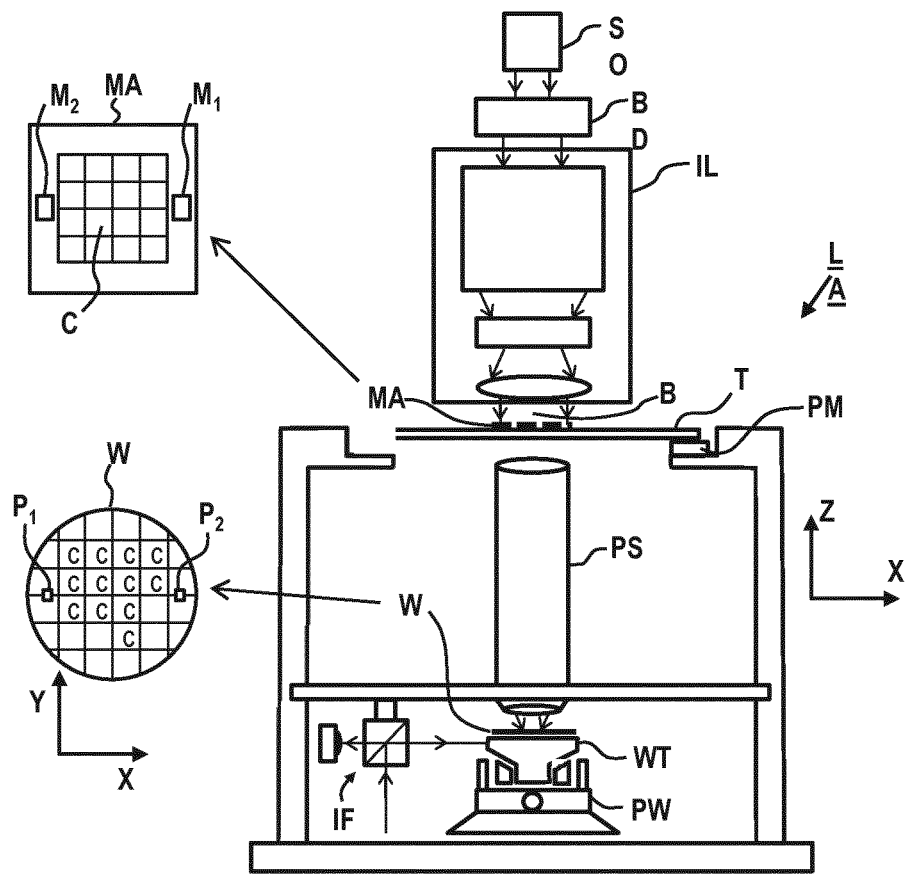
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
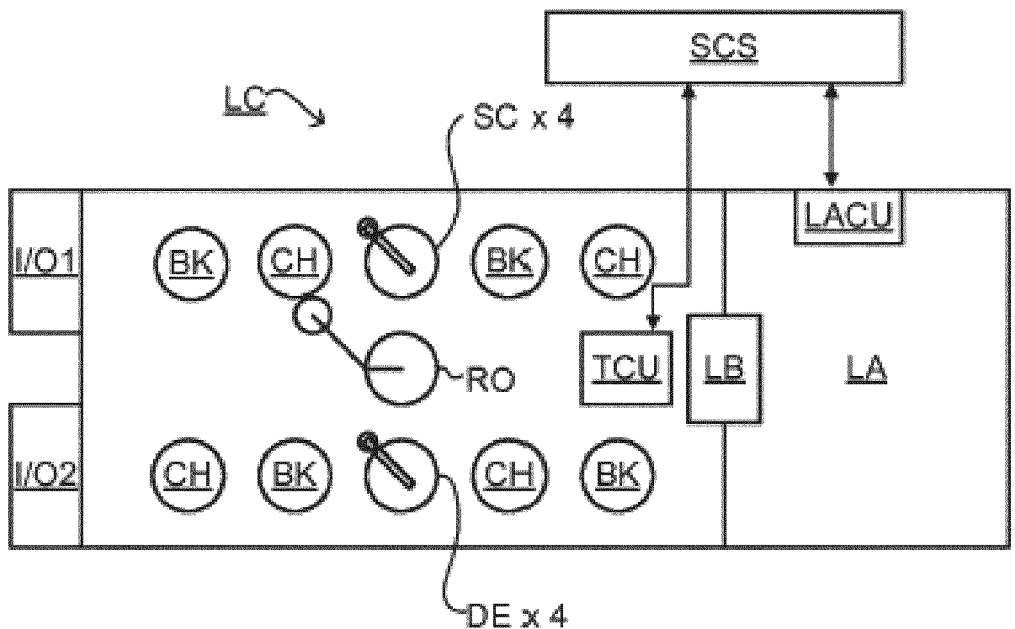
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
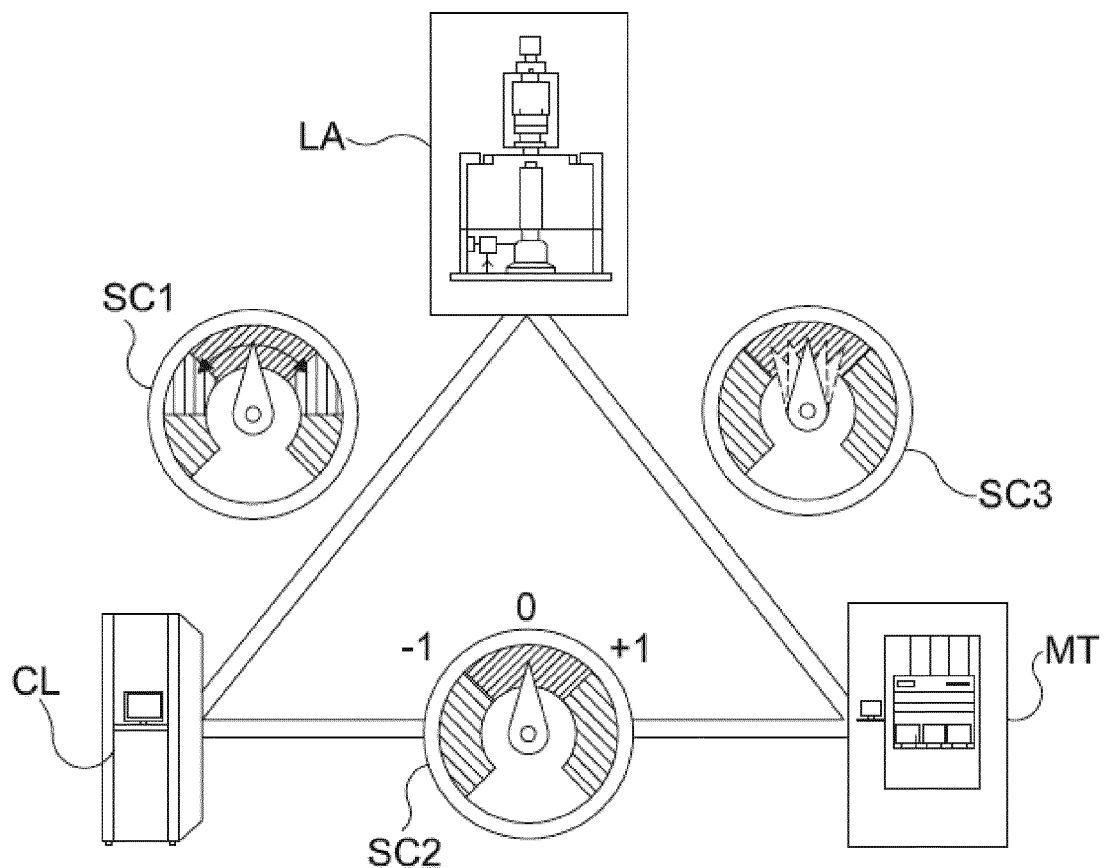
FIG. 3 depicts a schematic representation of holistic lithography, representing a cooperation between three hey technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

The holistic control environment as described above may be used to provide an improved patterning process by having the patterning process settings used by the lithographic apparatus take into account the topology of the surface of the substrate. The metrology tool MT may provide measurements related to the substrate surface topology, which may be used by the computer system CL to perform calculations to improve adjustments to the patterning process settings. The computer system CL may make calculations using the metrology tool MT input data, relating to a parameter of the system and/or relating to parameters of the lithographic patterning process intended to be used to improve the functioning and performance of the lithographic apparatus LA. The parameters may include overlay, focus and/or dose but need not be limited to these examples, as will be appreciated by a skilled person.

The computer system CL may be configured to provide an estimation of a parameter across a region on the substrate. The parameter may for example be dose, focus and/or overlay of the patterning process or any parameter indicative thereof. The parameter may relate to an effect of the surface topology of the substrate on these parameters. The region of the substrate in which the parameter is to be measured may be divided, also referred to as sliced, into a plurality of sub-regions. The division into sub-regions may be so that the sub-regions cover the entire region, and that the sub-regions do not overlap.

Figure 5:
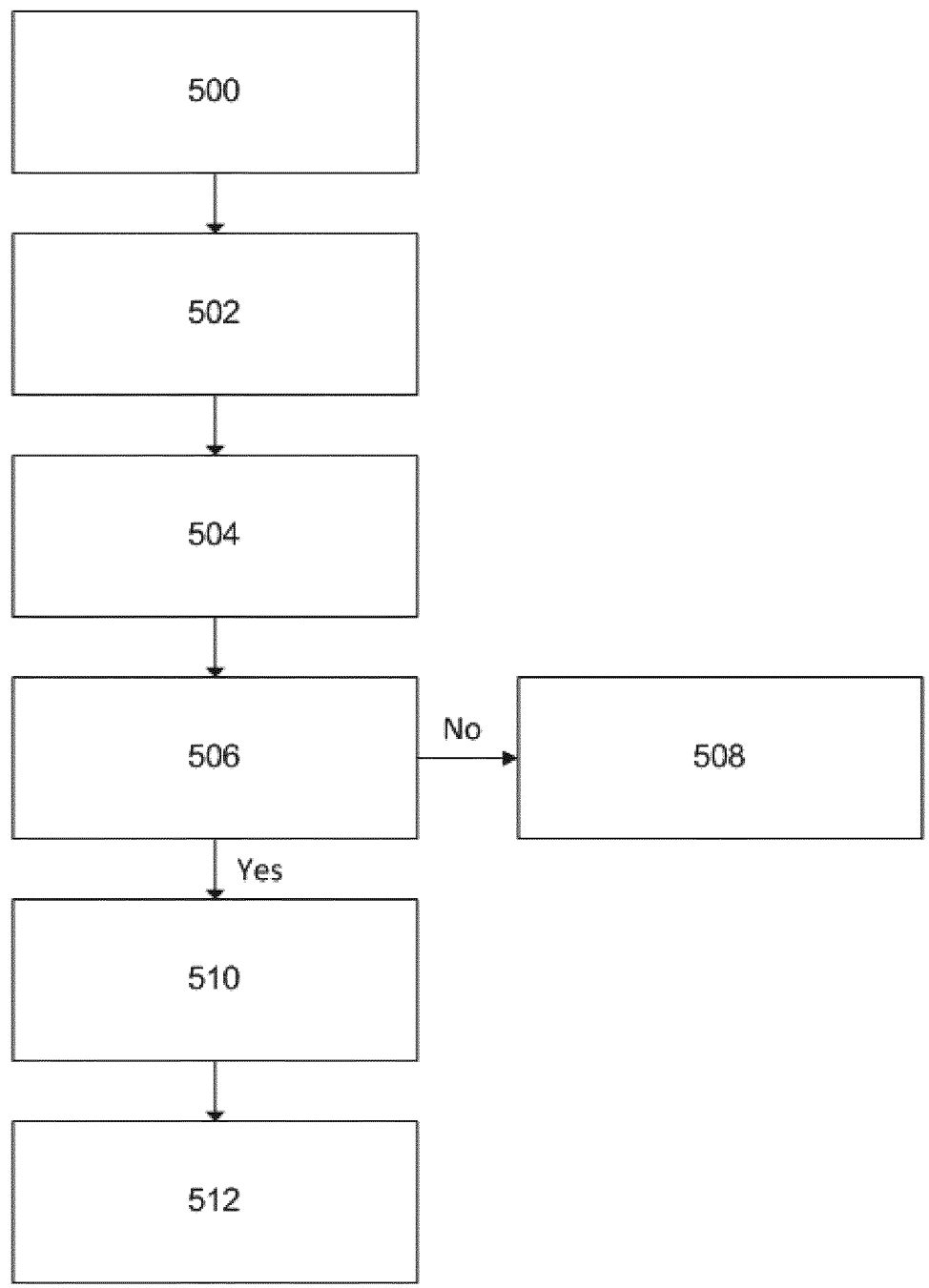
FIG. 5 depicts a flow diagram of a method for determining a property of a structure fabricated on a substrate.

FIG. 5 shows a flow diagram showing a method for estimating a parameter across a region on a substrate.

The computer system CL may obtain 500 one or more values of the parameter for at least two sub-regions of the plurality of sub-regions position in a region. The computer system CL may obtain a plurality of parameter values. In exemplary arrangements, the computer system CL may obtain the values from another apparatus, such as the metrology tool MT. The metrology tool may have undertaken a plurality of measurements of the parameter across the region of the substrate and these measurements may form the values of the parameter obtained by the computer system CL. The measurements undertaken by the metrology tool MT may be at specific, predetermined locations based on the locations on the substrate of one or more features, such as targets or product features, that allow the measurement to be undertaken when the parameter is associated with imaging characteristics of a lithographic process Alternatively, the measurements undertaken by the metrology tool MT may relate to a quantity other than the parameter to be estimated by the computer system CL, and one or both of the metrology tool MT or computer system CL may perform calculations or otherwise process data resulting from the measurements, to obtain values of the parameter to be used in the estimation by the computer system CL.

The computer system CL may divide 502 the region of the substrate into sub-regions.

Figure 4A:
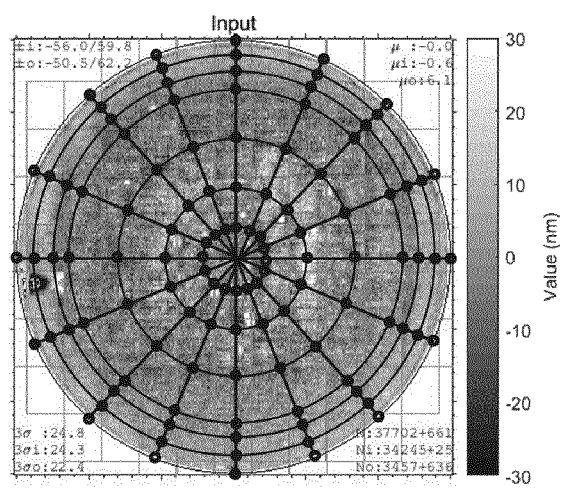
FIG. 4($a$) depicts a division of a region on a substrate into sub-regions using a radial pattern.
Figure 4B:
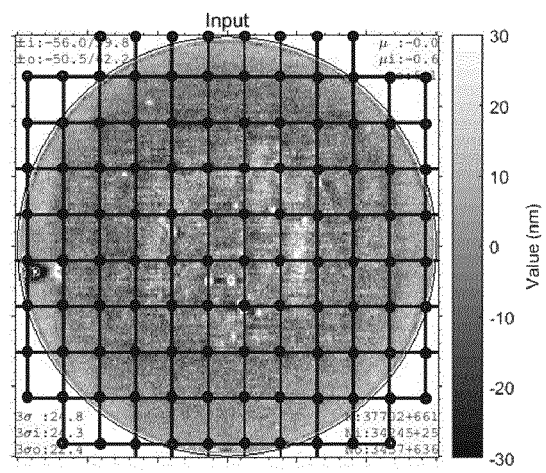

FIGS. 4(a) and 4(b) show exemplary methods for dividing the region on the substrate into sub-regions. FIG. 4(a) shows divisions into sub-regions using radial divisions. FIG. 4(b) shows divisions into sub-regions using a rectangular grid, a rectangular repetitive feature across a region. In FIGS. 4(a) and 4(b) the region comprises the entire substrate, but smaller regions of the substrate may be divided in alternative arrangements.

The division of the region into sub-regions can be undertaken by the computer system CL. The division of the region may be chosen to match, use or take advantage of properties of the substrate. In one example, the region comprises an area of the substrate which has previously been patterned using a lithographic apparatus or other patterning system, for example for the fabrication of integrated circuits (ICs). The patterns may have been exposed and created using exposure fields, or dies, wherein the region comprises a plurality of fields. The sub-regions may have been chosen to overlap with, or be coincident with, the size and location of the patterned fields in the region. Alternatively, the sub-region size may be chosen to contain a plurality of fields.

In some cases, each field may contain the same pattern, wherein a periodically repeating pattern may be created by the plurality of fields. Periodic patterns or other significant patterns may also exist within a single field. Alternatively, a repeating pattern may be formed by a plurality of fields. The fields may be rectangular in shape or square in shape.

In the example described herein, the sub-regions comprise rectangular shaped sub-regions having an x dimension and a y dimension, wherein the x and y axes are orthogonal in a plane substantially coincident with the surface of the substrate.

The computer system CL may estimate the parameter at a position in the region by evaluation of a function, the function comprising piecewise defined base functions. The function may be evaluated using the obtained values for the parameter at a number of discrete locations in the region of the substrate and within at least two sub-regions. The function has the property that it is continuous between adjacent sub-regions. In this instance, a function is continuous if sufficiently small changes in the location associated with the function input result in arbitrarily small changes in function output. The function may be used to estimate the parameter at any position in a sub-region based on the obtained values for the parameter. Further, the function may be used to estimate the parameter across an entire sub-region or a plurality of entire sub-regions.

The function comprises piecewise defined base functions, or specifically may comprise splines or NURBS, wherein each single base function is defined across a sub-region of the region, also referred to as face or section, within the piecewise base function description, that is to say, the piecewise division into faces of the function evaluated across position in the region corresponds to the division of the region into sub-regions.

As used herein, the term "adjacent" in respect of first and second sub-regions encompasses the first and second sub-regions having at least one shared boundary, or having a gap therebetween.

It is noted that at the edges of a substrate a sub-region may be rectangular in shape but may not include a rectangular portion of the substrate, as can be seen in FIG. 4(b).

As discussed below, the function may comprise symmetrical base functions. Further, the function may be a spline function and in more specific examples may be a Non-Uniform Rational Basis Spline (NURBS) function.

In one specific exemplary arrangement, the computer system CL may estimate the parameter at a position in the region of the substrate by undertaking the steps shown in FIG. 5. More specifically, the computer system CL may determine a plurality of provisional estimations of the parameter based on different functions and/or different orders of a function. The computer system CL may then select one of the provisional estimations to be the estimation of the parameter based on a performance indicator.

Referring to FIG. 5, the computer system CL may calculate 504 the plurality of provisional estimations. In one example in which the sub-regions are rectangular, this may be done by estimating the parameter a plurality of times using different functions and/or different orders of function across a portion of the region of the substrate, for example one of the sub-regions, in an x-direction and in a y-direction. For example, the computer system CL may use four different orders of a spline function and may calculate an estimation for all four orders of the function in the x-direction and in the y-direction. This would result in 16 provisional estimations across the portion of the region of the substrate, all combinations of the four x and y estimations.

In an example embodiment, a set of provisional estimations is determined by the computer system CL using NURBS of different polynomial orders. The NURBS calculate a set of fits around the obtained values in the sub-regions, wherein each fit is a polynomial of a different order. The NURBS fits are calculated so that continuity of the fit is achieved across the region, and in particular at boundaries between adjacent sub-regions, or "faces" of the NURBS fit.

Provisional estimations may be determined for a plurality of sub-regions and may be calculated across the entire region of the substrate.

The performance indicator may be used to discriminate between the provisional estimations. In one example, this may be a two-stage process as shown in FIG. 5.

The performance indicator may be based on one or both of minimum and/or maximum values of the provisional estimations and/or a comparison of the values of the provisional estimations at a location in the region and an obtained value of the parameter at the same or a proximate location.

The computer system CL may compare 506 minimum and/or maximum obtained values of the parameter with minimum and/or maximum values of the provisional estimations to determine whether the provisional estimation is to be rejected. If the minimum and/or maximum obtained value has a magnitude smaller than the magnitude of the minimum and/or maximum value of the provisional estimation then the provisional estimation is rejected 508. After this process has been completed for a plurality (e.g. all) of the provisional estimations there will be a number of rejected provisional estimations and a number of remaining provisional estimations. The remaining provisional estimations may be considered to be "valid" provisional estimations.

The estimation of the parameter may then be selected 510 from the valid provisional estimations. The computer system CL may calculate, for each of the valid provisional estimations, a difference, or residual, between the obtained values of the parameter and provisional estimations of the parameter. This may be the difference between an obtained value of the parameter, and a value of the provisional estimation at the position (or a proximate position) of the obtained parameter value. The calculation may be performed for a plurality, and in some cases for each, of the obtained values of the parameter.

The computer system CL may be configured to select 512 the estimation of the parameter from among the remaining provisional estimations based on the calculated difference. The computer system CL may select as the estimation, the provisional estimation for which the magnitude of the calculated difference is the smallest. In certain embodiments, the computer system CL may determine the smallest magnitude of the difference on the smallest 3 standard deviation number of all remaining provisional estimations.

The computer system CL may obtain at least one value of the parameter for each sub-region in the region and in some arrangements may obtain a plurality of values of the parameter for one or more of the sub-regions. Alternatively, there may be at least one sub-region within the region, for which the computer system CL did not obtain a value of the parameter. In such arrangements, the computer system CL may calculate the estimation to encompass a sub-region for which no values were obtained based on values obtained for one or more further sub-regions. The computer system CL may obtain at least 2 values of the parameter for each sub-region, or at least 3, or at least 4 values of the parameter for each sub-region. The amount of values obtained for each sub-region may be the same, or may vary.

The computer system CL may estimate the parameter in every sub-region of the region by evaluating the function for at least one position in each sub-region. The computer system CL may estimate a parameter at every position in the region by evaluating the function for every position in each sub-region. Alternatively, the region may comprise a sub-region in which no estimation is made, that is to say, the function is not evaluated in that sub-region. A function may not be evaluated in a sub-region if no value of the parameter was obtained for that sub-region. Alternatively, a function may be evaluated in a sub-region for which no value of the parameter was obtained, by using data from one or both of parameter values and parameter estimations in other sub-regions.

As mentioned above, the function used by the computer system CL to estimate the parameter may form part of a spline function. A spline function means a mathematical function which is defined as a piecewise polynomial function. A single piece of the piecewise polynomial description may be referred to as a face. The function used by the computer system CL to estimate the parameter may comprise, or be composed from, one or more non-uniform rational basis splines (NURBS). NURBS are a family of piecewise polynomial descriptions with adjustable continuity properties tying the pieces together.

The function used by the computer system CL to estimate a parameter may be a piecewise polynomial spline, or specifically may comprise NURBS, wherein a sub-region of the region corresponds to a single polynomial, also referred to as face or section, within the piecewise polynomial description, that is to say, the piecewise division into faces of the function evaluated across position in the region corresponds to the division of the region into sub-regions.

A piecewise polynomial function comprises a plurality of polynomials, wherein each polynomial has an order, which may be the highest degree of a term in the polynomial with a non-zero coefficient when the polynomial is written in its expanded form. The order of the polynomial determines the nature and complexity of the function. A piecewise polynomial function may comprise polynomials of different orders, or each polynomial in the piecewise polynomial function may have the same order. A polynomial also has a number of variables, and specifically may have one variable, e.g. x, or two variables, e.g. x and y.

In the function used by the computer system CL to estimate a parameter in the region, the highest, or maximum, order of polynomials to be used in a piecewise polynomial functional description may be determined by the amount of values of the parameter obtained for the region by the computer system CL. Specifically, this may be determined by the amount of measurement data points provided by metrology tool MT to the computer system CL. The highest order of a polynomial in a piecewise description may be determined by the number of values of the parameter obtained for the sub-region corresponding to a face of the piecewise description.

The computer system CL may use NURBS as a function to estimate the parameter. A property of NURBS is that the piecewise polynomials can be defined so that they are continuous between faces. This continuity may be geometric continuity, that is to say, the transition from one face to an adjacent face is smooth, without breaks in the function output. In the case where the function describes a twodimensional structure, a surface, a function may be considered to be smooth if it has no breaks in the surface. In case of a mathematical function, smoothness in a region can also be defined by its differentiability, that is to say whether a derivative of the function exists at all points of the function in that region. If the derivative of the mathematical function can be taken for each position in a region of the function it is considered to be smooth. The derivative of a function may in itself be a differentiable function, as may one or more further resulting derivatives of that function. The amount of times a function is differentiable is an indication of the level of continuity, or smoothness, of the original function. A function may be considered to be more smooth as the amount of times it is differentiable increases. In some embodiments of the invention, the function used to estimate the parameter is at least differentiable along the entire function twice.

Continuity for piecewise defined functions, for example NURBS, may be defined as above for portions of the function within a face of the piecewise function, for example by not having breaks in the function within a single piece, and may further require that the function output value on a boundary between adjacent faces is the same for each piecewise function describing a position on that boundary.

Using a NURBS fit to estimate the parameter makes it possible to have faces of the piecewise function to have different shapes and sizes. This makes it possible for the computer system CL, when using NURBS to estimate a parameter, to adjust the sub-region shape to optimize the capture of the features of that parameter. For example, dose-related parameters may benefit from radially-based sub-regions as some physical properties of the etching and/or deposition tools are transmitted via radial actuators. Further, overlay and focus parameters may benefit from rectangular sub-regions linked to fields of the lithographic apparatus in the region. This makes NURBS a suitable function for estimating parameters on substrates containing previously deposited patterns. NURBS also makes it possible to use different sizes of faces in the piecewise function. This may be useful in a situation where more values of the parameter are available in some parts of the region compared to other parts of the region. For example, the size of the faces can be adjusted to have a similar amount of values of the parameter in each face.

NURBS are suitable for estimating a parameter in both areas with sparse data points of the value of the parameter available, and in areas with more densely packed data points of parameter values. This enables NURBS to provide a high quality parameter estimation both in inner and edge sub-regions of a region on a substrate. If a sub-region corresponds to a field of the lithographic apparatus, an inner sub-region comprises the entire field. Edge sub-regions however, may contain a partial field, as the field may extend beyond the edge of the region of the substrate, as is illustrated, for example in FIG. 4(b), where edge sub-regions have curved edges, and only cover a part of the field as set out by the rectangular grid. A metrology tool MT may determine measurement data points based on particular points in the field, for example, markers deposited in a previous patterning layer. Some of the values of the parameter may have been determined for parts of the field falling outside the substrate of an edge sub-region on the substrate. Therefore, the amount of values of the parameter available in an edge region may be lower. An NURBS function is able to handle this difference in available data and provide a high quality estimation across the region of the substrate. A NURBS function can provide a high quality estimation in both sub-regions with sparse data points, and sub-regions with more data points for steep gradients in topology, such as detailed and high order features.

Further embodiments of the invention are disclosed in the list of numbered embodiments below:

1. A method for estimating a parameter across a region on a substrate, the region being divided into a plurality of sub-regions, the method comprising:
   obtaining values of the parameter for at least two sub-regions out of said plurality of sub-regions; and
   estimating the parameter for a position on the region by evaluation of a function having said values of the parameter as input values, wherein the function: a) comprises piecewise defined base functions, wherein a single base function is defined across a sub-region; and b) is continuous between one or more adjacent sub-regions of the at least two sub-regions comprised within the region.
2. The method according to embodiment 1 wherein the plurality of sub-regions of the region form a rectangular grid.
3. The method according to any preceding embodiment wherein one or more of the plurality of sub-regions is substantially coincident with one or more dies or fields on the substrate.
4. The method according to any preceding embodiment wherein at least one value of the parameter is obtained per sub-region.
5. The method according to any of embodiments 1 to 3 wherein at least for one sub-region no value of the parameter is obtained.
6. The method according to any preceding embodiment wherein at least for one sub-region the function is not evaluated.
7. The method according to any preceding embodiment, wherein the base functions are symmetrical.
8. The method according to any preceding embodiment, wherein the function forms part of a spline function.
9. The method according to any preceding embodiment, wherein the function is composed out of one or more non-uniform rational basis splines.
10. The method according to any of preceding embodiment, further comprising determining a number of measurements of the parameter associated with the region, and determining an order of the function based on the number of measurements.
11. The method according to any preceding embodiment, wherein estimating the parameter across region comprises:
    determining a plurality of provisional estimations of the parameter based on different orders of the function; and
    selecting one of the provisional estimations to be the estimation of the parameter based on a performance indicator of the provisional estimations.
12. The method according to embodiment 11, wherein the performance indicator is based on minimum and/or maximum values of the provisional estimations.
13. The method according to embodiment 12, wherein selecting one of the provisional estimations comprises rejecting any provisional estimation having a magnitude of the minimum and/or maximum values that exceeds a magnitude of minimum and/or maximum values of the one or more measurements, and accepting any remaining provisional estimations.
14. The method according to embodiment 13, wherein selecting one of the provisional estimations further comprises selecting one of the accepted provisional estimations based on a difference between the one or more measurements of the parameter and a value of the accepted provisional estimations at a position of the one or more measurements.

15. The method according to embodiment 14, further comprising selecting the provisional estimation for which the magnitude of the difference is smallest.

16. The method according to any of embodiments 11 to 15, wherein the provisional estimations comprise polynomials of different orders.

17. The method according to any of embodiments 11 to 16, wherein determining the plurality of provisional estimations comprises:
   determining a first plurality of polynomials of different orders in a first direction;
   determining a second plurality of polynomials of different orders in a second direction transverse to the first direction; and
   combining different ones of the first and second polynomials to form the plurality of provisional estimations.

18. A computer program comprising instructions which, when executed on at least one processor, cause the at least one processor to control an apparatus to carry out a method according to any preceding embodiment.

19. An apparatus for estimating a parameter across a region on a substrate, the region being divided into a plurality of sub-regions, the apparatus comprising a processor configured to execute computer program code to undertake the method of:
   obtaining values of the parameter for at least two sub-regions out of said plurality of sub-regions; and
   estimating the parameter for a position on the region by evaluation of a function having said values of the parameter as input values, characterized in that the function is continuous between one or more adjacent sub-regions of the at least two sub-regions comprised within the region for any number of input values and any required accuracy of the estimate.

20. A metrology system for estimating a parameter across a region on a substrate and comprising the apparatus of embodiments 19.

21. A lithographic system comprising the metrology system of embodiment 20.22. A lithographic cell system comprising the lithographic system of embodiment 21.

22. A method for estimating a parameter across a region on a substrate, the region being divided into a plurality of sub-regions, the method comprising: obtaining values of the parameter for at least two sub-regions out of said plurality of sub-regions; and estimating the parameter for a position within the region by evaluation of a function having said values of the parameter as input values, wherein the function: a) comprises piecewise defined base functions, wherein each base function is defined across a sub-region; and b) is continuous between at least two adjacent sub-regions.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

A computer program may be configured to provide any of the above described methods. The computer program may be provided on a computer readable medium. The computer program may be a computer program product. The product may comprise a non-transitory computer usable storage medium. The computer program product may have computer-readable program code embodied in the medium configured to perform the method. The computer program product may be configured to cause at least one processor to perform some or all of the method.

Various methods and apparatus are described herein with reference to block diagrams or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s).

Computer program instructions may also be stored in a computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/Blu-ray).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified in the block diagrams and/or flowchart block or blocks.

Accordingly, the invention may be embodied in hardware and/or in software (including firmware, resident software, micro-code, etc.) that runs on a processor, which may collectively be referred to as "circuitry," "a module" or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method comprising:
    obtaining values of a parameter for at least two sub-regions out of a plurality of sub-regions of a region on a substrate; and
    estimating, by a hardware computer system, the parameter for a position within the region by evaluation of a function having the values of the parameter as input values, wherein the function:
    a) comprises piecewise defined base functions, wherein each base function is defined across a sub-region, and
    b) is continuous between at least two adjacent sub-regions; and
    configuring a manufacturing process with respect to the substrate based on the estimated parameter and/or providing a signal representing, or based on, the estimated parameter to a tool or system for use by the tool or system in controlling or configuring a manufacturing process with respect to the substrate.

2. A computer program product having a non-transitory computer-readable medium, the medium comprising instructions, which instructions, when executed by at least one processor, are configured to cause the at least one processor to at least:
    obtain values of a parameter for at least two sub-regions out of a plurality of sub-regions of a region on a substrate; and
    estimate the parameter for a position within the region by evaluation of a function having the values of the parameter as input values, wherein the function:
    a) comprises piecewise defined base functions, wherein each base function is defined across a sub-region, and
    b) is continuous between at least two adjacent sub-regions; and
    configure a manufacturing process with respect to the substrate based on the estimated parameter and/or provide a signal representing, or based on, the estimated parameter to a tool or system for use by the tool or system in controlling or configuring a manufacturing process with respect to the substrate.

3. The computer program product according to claim 2, wherein the plurality of sub-regions of the region form a rectangular grid.

4. The computer program product according to claim 2, wherein one or more sub-regions of the plurality of sub-regions is substantially coincident with one or more dies or fields on the substrate.

5. The computer program product according to claim 2, wherein at least one value of the parameter is obtained per sub-region.

6. The computer program product according to claim 2, wherein at least for one sub-region no value of the parameter is obtained.

7. The computer program product according to claim 2, wherein at least for one sub-region the function is not evaluated.

8. The computer program product according to claim 2, wherein the function forms part of a spline function.

9. The computer program product according to claim 2, wherein the base functions are symmetrical.

10. The computer program product according to claim 2, wherein the function is composed out of one or more non-uniform rational basis splines.

11. The computer program product according to claim 2, wherein the instructions are further configured to cause the at least one processor to determine a number of measurements of the parameter associated with the region, and determine an order of the function based on the number of measurements.

12. The computer program product according to claim 2, wherein the instructions configured to cause the at least one processor to estimate the parameter are further configured to cause the at least one processor:
    determine a plurality of provisional estimations of the parameter based on different orders of the function; and
    select one of the provisional estimations to be the estimation of the parameter based on a performance indicator of the provisional estimations.

13. The computer program product according to claim 12, wherein the performance indicator is based on minimum and/or maximum values of the provisional estimations.

14. The computer program product according to claim 13, wherein the instructions configured to cause the at least one processor to select one of the provisional estimations are further configured to cause the at least one processor:
    reject any provisional estimation having a magnitude of the minimum and/or maximum value that exceeds a magnitude of minimum and/or maximum value of the one or more measurements, and
    accept any remaining provisional estimation.

15. The computer program product according to claim 14, wherein the instructions configured to cause the at least one processor to select one of the provisional estimations are further configured to cause the at least one processor to select one of the accepted provisional estimations based on a difference between the one or more measurements of the parameter and a value of the accepted provisional estimation at a position of the one or more measurements.

16. The computer program product according to claim 12, wherein the provisional estimations comprise polynomials of different orders.

17. The computer program product according to claim 12, wherein the instructions configured to cause the at least one processor to determine the plurality of provisional estimations are further configured to cause the at least one processor:
    determine a first plurality of polynomials of different orders in a first direction;

determine a second plurality of polynomials of different orders in a second direction transverse to the first direction; and combine different ones of the first and second polynomials to form the plurality of provisional estimations.

18. An apparatus comprising:

a memory having computer program code; and a processor configured to execute the computer program code, the computer program code, upon execution by the processor, configured to cause the processor to at least:

obtain values of a parameter for at least two sub-regions out of a plurality of sub-regions of a region on a substrate; and estimate the parameter for a position within the region by evaluation of a function having the values of the parameter as input values, wherein the function:

a) comprises piecewise defined base functions, wherein a single base function is defined across a sub-region, and b) is continuous between one or more adjacent sub-regions of the at least two sub-regions comprised within the region; and configure a manufacturing process with respect to the substrate based on the estimated parameter and/or provide a signal representing, or based on, the estimated parameter to a tool or system for use by the tool or system in controlling or configuring a manufacturing process with respect to the substrate.

19. A metrology system for estimating a parameter across a region on a substrate, the metrology system comprising the apparatus of claim 18.

20. A lithographic system comprising the metrology system of claim 19.

* * * * *